(12) United States Patent
Adams et al.

(10) Patent No.: US 6,269,461 B1
(45) Date of Patent: Jul. 31, 2001

(54) TESTING METHOD FOR DYNAMIC LOGIC KEEPER DEVICE

(75) Inventors: Robert Dean Adams, Hanover, NH (US); Patrick R. Hansen, Essex Junction; Phillip Nigh, Willston, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/067,055

(22) Filed: Apr. 27, 1998

(51) Int. Cl.[7] ................................................. G01R 31/28
(52) U.S. Cl. ............................................................ 714/724
(58) Field of Search .................................... 714/724, 733, 714/734; 326/93, 33, 95, 98, 110; 327/379; 365/201

(56) References Cited

U.S. PATENT DOCUMENTS

| 5,122,738 | 6/1992 | Simpson et al. ..................... 324/158 |
| 5,399,918 | * 3/1995 | Taylor et al. ......................... 326/110 |
| 5,440,243 | 8/1995 | Lyon ....................................... 326/33 |
| 5,541,537 | 7/1996 | Kim et al. ............................. 326/121 |
| 5,557,620 | 9/1996 | Miller, Jr. et al. .................... 714/733 |
| 5,592,143 | 1/1997 | Adams et al. ..................... 340/146.2 |
| 5,671,151 | 9/1997 | Williams .............................. 364/489 |
| 5,831,451 | * 11/1998 | Bosshart ................................. 326/93 |
| 5,831,990 | * 11/1998 | Queen et al. ......................... 714/733 |
| 5,910,735 | * 6/1999 | Allen ..................................... 326/95 |
| 5,949,266 | * 9/1999 | Hinds et al. .......................... 327/208 |
| 6,002,292 | * 12/1999 | Allen et al. ........................... 327/379 |
| 6,014,041 | * 1/2000 | Somasekhar et al. ............... 326/115 |

* cited by examiner

*Primary Examiner*—Albert Decady
*Assistant Examiner*—Shelly A Chase
(74) *Attorney, Agent, or Firm*—Eugene I. Shkurko

(57) ABSTRACT

A testing device for slowly bleeding charge away from a primary node in a dynamic logic circuit. A properly functioning keeper device in the dynamic logic circuit will maintain the primary node in a precharged state even in the face of this bleeding device. If the logic circuit output flips after the bleeder device begins bleeding charge, a defective keeper device is thereby identified.

6 Claims, 4 Drawing Sheets

TESTING METHOD FOR DYNAMIC LOGIC KEEPER DEVICE

BACKGROUND OF THE INVENTION

1. Technical Field of the Invention

This invention pertains to dynamic logic circuits. In particular, this invention is directed to testing dynamic logic circuits that include a half-latch, also known as a keeper device. A novel apparatus and method is described for testing whether keeper structures in dynamic logic are defective.

2. Background Art

A keeper device maintains a dynamic logic gate's pre-charge state and adds significant robustness to the circuit. In comparison to static logic circuits, dynamic logic circuits require a pre-charge pulse (RESET signal) that is followed by an evaluation phase wherein input signal data causes the gate to evaluate (the input signal data) by outputting a high or low output signal. In static logic, typically there are PFET pull-up devices and NFET pull-downs that are both connected to receive input signal data sent to the static logic gate.

A useful feature of a dynamic logic gate is the use of a half-latch and inverter (shown in FIG. 1) to maintain a precharge state of the gate. FIG. 1 illustrates an example generic logic gate having a RESET input 11, a half-latch 10, inverter 13, an output, and an evaluate function determined by the structure of logic tree 12. The logic tree may be connected to the primary node A at only one point or at several points, depending on the logic function to be performed. A logic gate such as in this example can be defective in many ways. The objective of testing is to identify those defective gates. One of the defect modes affects the keeper device 10 and makes it inoperative. For the gate shown in FIG. 1, the PFET keeper 10 can have an open source, an open drain, or the gate stuck at a "1". When such a defect exists the gate will typically function "properly" as a result of the inherent capacitance in the node A at the top of the logic tree 12. It will not have the robustness required to ensure proper operation at all conditions, however. Currently there is no good way to test dynamic logic gates and ensure that the keeper devices are indeed intact.

Dynamic logic has both a precharge and an evaluate time during its normal operation. During precharge, a gate is reset so that its output(s) and primary internal node(s) are pre-charged to a given state, e.g., a high state (binary "1"). Then when data (In1 . . . InX) arrives, the gate evaluates and, if appropriate (e.g. the logic tree couples the primary node to ground), the internal node discharges and the output transitions to the opposite state. Dynamic logic gates are frequently designed with an inverter on the output and a half latch to hold the primary internal node at its precharge state. This is comparable to a kind of memory function because the primary node is held in a high or low ("1" or "0") precharge state.

In the operational sequence for a dynamic gate with an NFET dominated logic tree, the reset signal, pulsed low, pulls the primary node high, which causes the output to go low (through the inverter). The output, coupled to the half-latch PFET, keeps the half-latch on and the primary node is pulled and maintained high. The PFET half-latch thus maintains the gate in its reset state until data arrives. Even if "reset" goes high, the half-latch maintains the primary node high in a noisy environment.

SUMMARY OF THE INVENTION

A problem exists verifying that a dynamic logic gate is fault free, with respect to its keeper device. Three solutions are proposed. First, a method is presented for testing dynamic logic gates without including the novel apparatus of the present invention. Second is a method for testing logic gates which implements the novel apparatus. Third, the novel apparatus itself includes a device for very slowly bleeding charge from a primary node of dynamic logic gate to determine whether the bleeding causes an erroneous gate output, hence, uncovering a defective keeper device whose function it is to maintain the charge state of the primary node.

Other features and advantages of this invention will become apparent from the following detailed description of the presently preferred embodiment of the invention, taken in conjunction with the accompanying drawings.

BEST MODE FOR CARRYING OUT THE INVENTION

Figure 1:
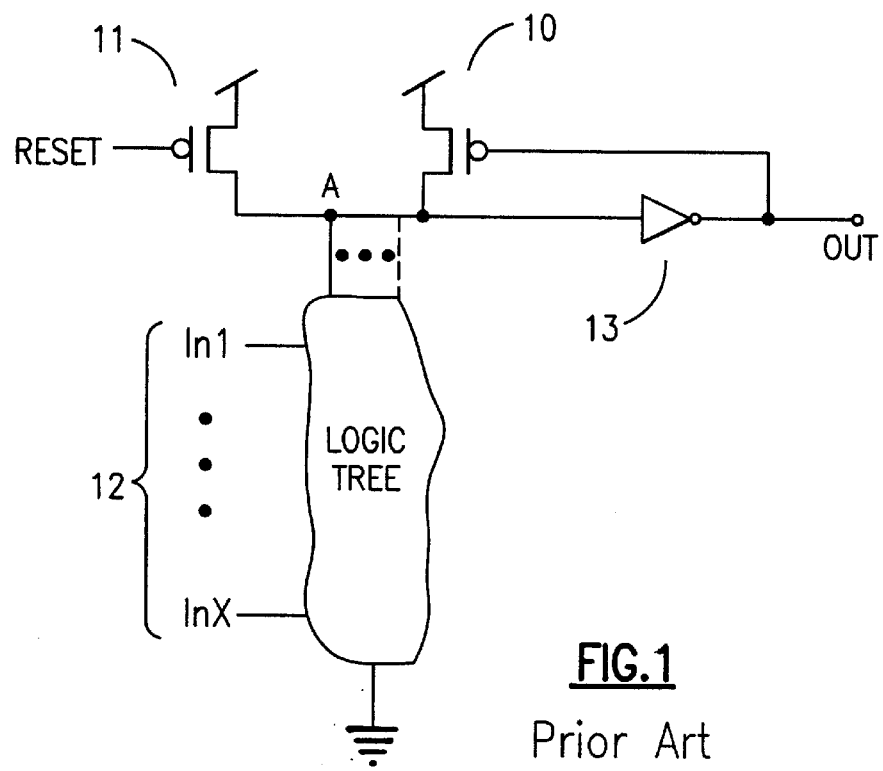
FIG. 1 illustrates a generic dynamic gate with a primary node half latch device.
Figure 2:
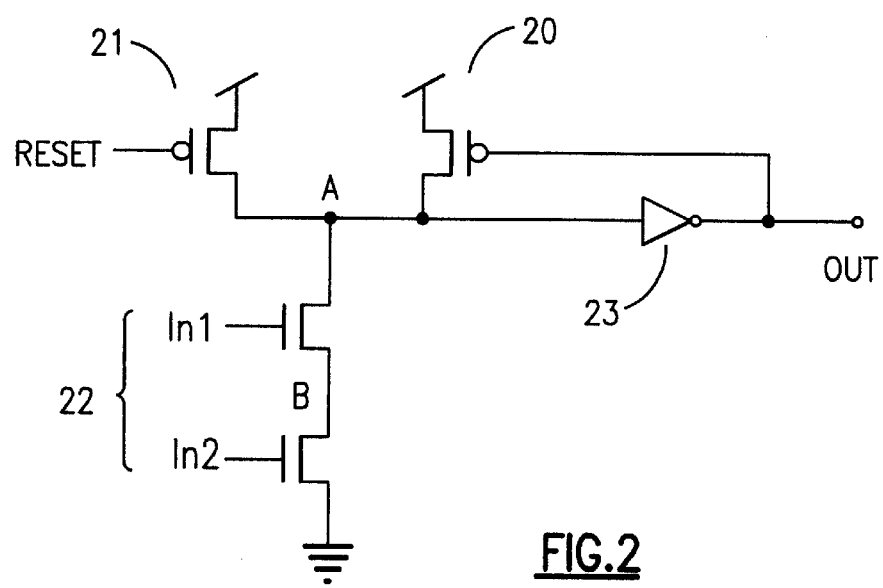
FIG. 2 illustrates a typical dynamic AND gate with a primary node half latch device.

FIG. 2 illustrates a standard dynamic gate having a reset signal coming into the reset PFET 21, a half-latch 20 which holds the primary node in the reset state, and a logic tree 22 below (which, in this example, creates an AND gate out of the entire structure). This configuration is commonly used for dynamic logic. If such gates don't use half-latches they likely will pass test but are far more sensitive to noise. A problem arises when attempting to test for a defective half latch 20, which would also pass a standard test because a defective latch is similar, in some test aspects, to having no latch. The present invention provides the function of identifying a failing half latch.

Figure 3:
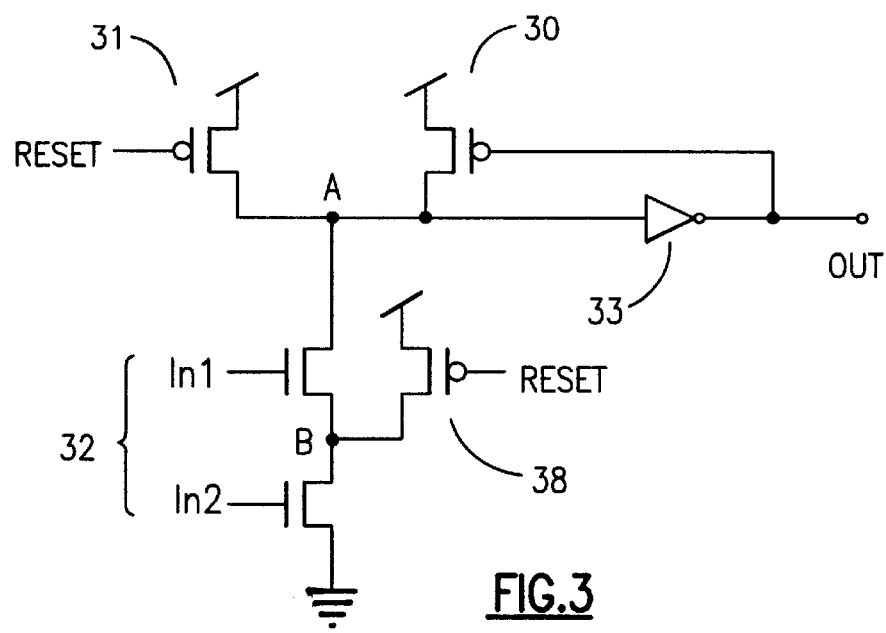
FIG. 3 illustrates a typical dynamic AND gate with an intermediate node restore device.

FIG. 3 illustrates a known modification to FIG. 2 for restoring (precharging) an intermediate node B of the gate using the same or different RESET signal as used for precharging the primary node A. Often the top (primary) node would be too heavily loaded for the keeper device to handle the charge sharing between the primary and intermediate nodes. Therefore an intermediate restore device 38 is frequently incorporated. By disabling the intermediate restore device the top node will see the full effect of the charge sharing and thus the circuit will fail under test, if the half latch keeper device is defective.

Figure 4:
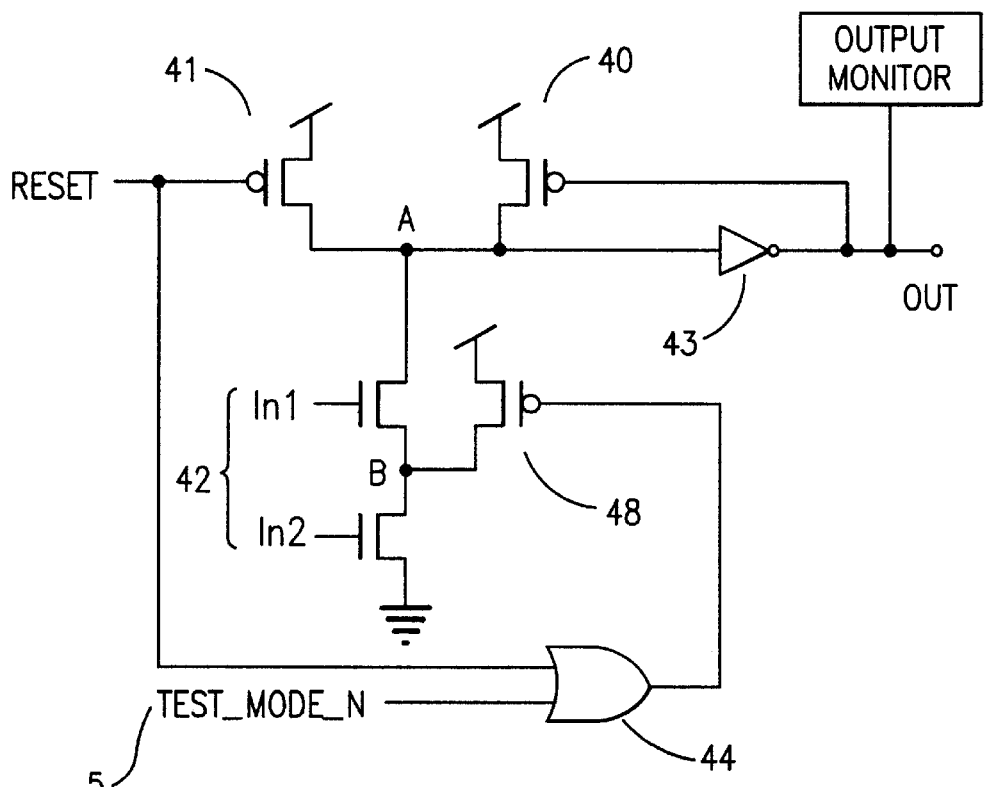
FIG. 4 illustrates circuit controls to disable an intermediate restore device.

FIG. 4 illustrates an example of the circuitry required to disable the intermediate restore device. A test mode signal is needed to turn off the intermediate restore along with some logic. The logic can be adjacent to each dynamic logic gate or it can be central as part of the clock generation circuitry. The intermediate devices can be tested in a similar fashion to the single keeper device. A circuit having the intermediate restore feature of FIG. 3 can be tested for a defective half-latch by turning off the intermediate restore as follows: after turning off PFET 48, by inputting a "1" (high) at Test_mode_N, the intermediate node B cannot be restored by the incoming RESET signal which then precharges only the primary node A. The primary node A will become sensitive to noise with a likely resultant failure (erroneous output data) if the half latch 40 is defective. A testing sequence is then applied as follows: In2 is set to a 1 (high) while In1 is zero (LOW) during a first cycle (i.e. precharging the intermediate node by coupling it to ground), then the inputs are reversed during a second cycle. During the first cycle the intermediate node B is precharged low. During the next cycle the primary node A should remain at a "1" (its precharge state) but, since the intermediate node has been discharged to ground, enough charge is coupled from the intermediate node onto the primary node (e.g. the intermediate node pulls down the primary node) and, if the half latch is defective, it will cause the output to flip, hence, providing an erroneous output. Thus, in this example, a properly performing half-latch will maintain the proper charge on the primary node and prevent the output from flipping. This test sequence might need to be repeated, depending on the technology, circuit topology, and device dimensions.

Figure 5:
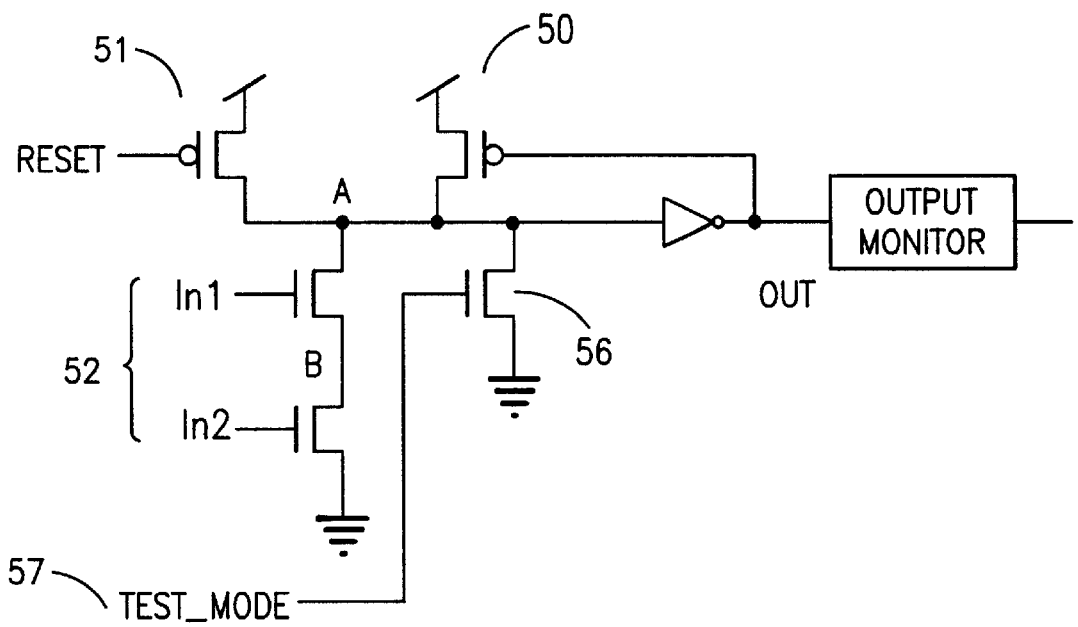
FIG. 5 illustrates the inventive testing device on a dynamic AND gate.
Figure 6:
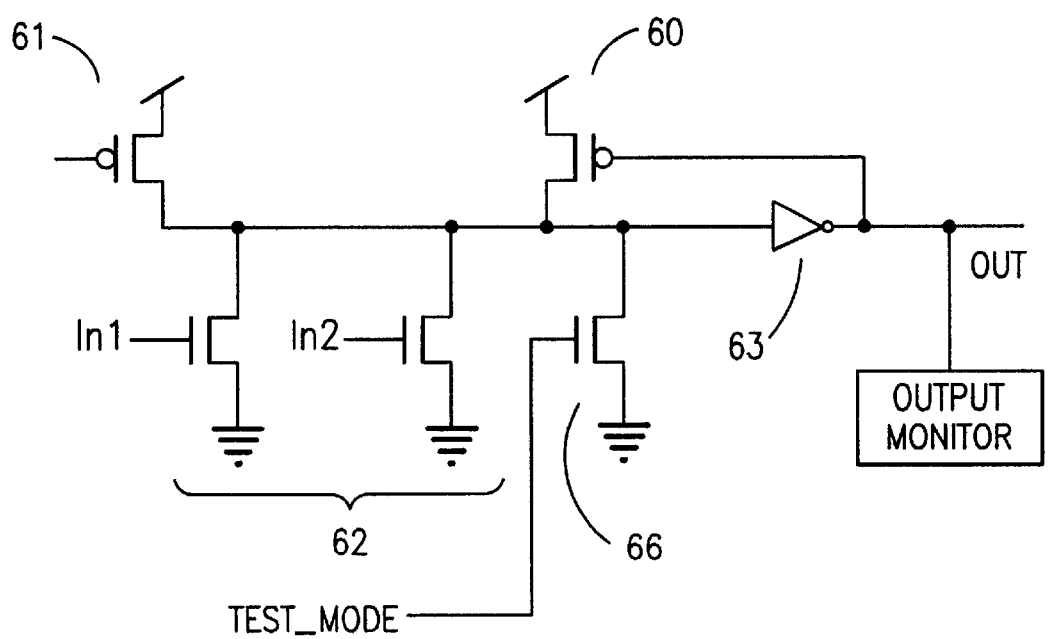
FIG. 6 illustrates the inventive testing device on a dynamic OR gate.

The testing method of the present invention includes the steps of providing a test mode signal and monitoring whether the output flips. In systems where BIST techniques might be employed that utilize the present inventive testing method, the required input patterns and output monitoring could be accomplished entirely on-chip. The results could then be stored in scannable latches or provided to an external tester through some other means. Embedded systems testing might require that the test input and output data monitoring be handled entirely by an external tester. The structure of the output monitoring means is not essential to the present invention, is well known in the art, and is not described further. FIGS. 5 and 6 illustrate different ways to implement an output monitor which depend on the testing environment.

The best alternative for testing the half-latch device is to include a minuscule pull-down device in the gate which discharges the primary node if the keeper device is defective. This discharging causes the gate output to flip, which is an event that may be monitored. Referring to FIG. 5, an NFET bleeder 56 having a Test_Mode input is coupled to the primary node A of the dynamic AND gate of FIG. 2. In the preceding figures, the PFET half-latch device is small (e.g. one fifth to one-tenth the logic tree FETs) because it is only used to hold high the primary node. By adding a similarly small or smaller NFET 56 to the logic gate(s) so as not to overcome the operation of the half-latch, a defective half-latch 50 (a PFET in this example) can be detected. When the test signal Test_Mode goes high with a defective PFET, the small NFET will discharge the primary node causing the monitored output to transition high, indicating a defective half-latch. If the half-latch is intact, it will retain the primary node in the high state (output retained low) even if Test_Mode is asserted high. When Test_Mode is asserted high, In1 and In2 must be maintained low so as not to present a discharge path to ground for the primary node. In operation, In1 and In2 arrive from preceding logic gates which have also been reset (precharged).

Figure 7:
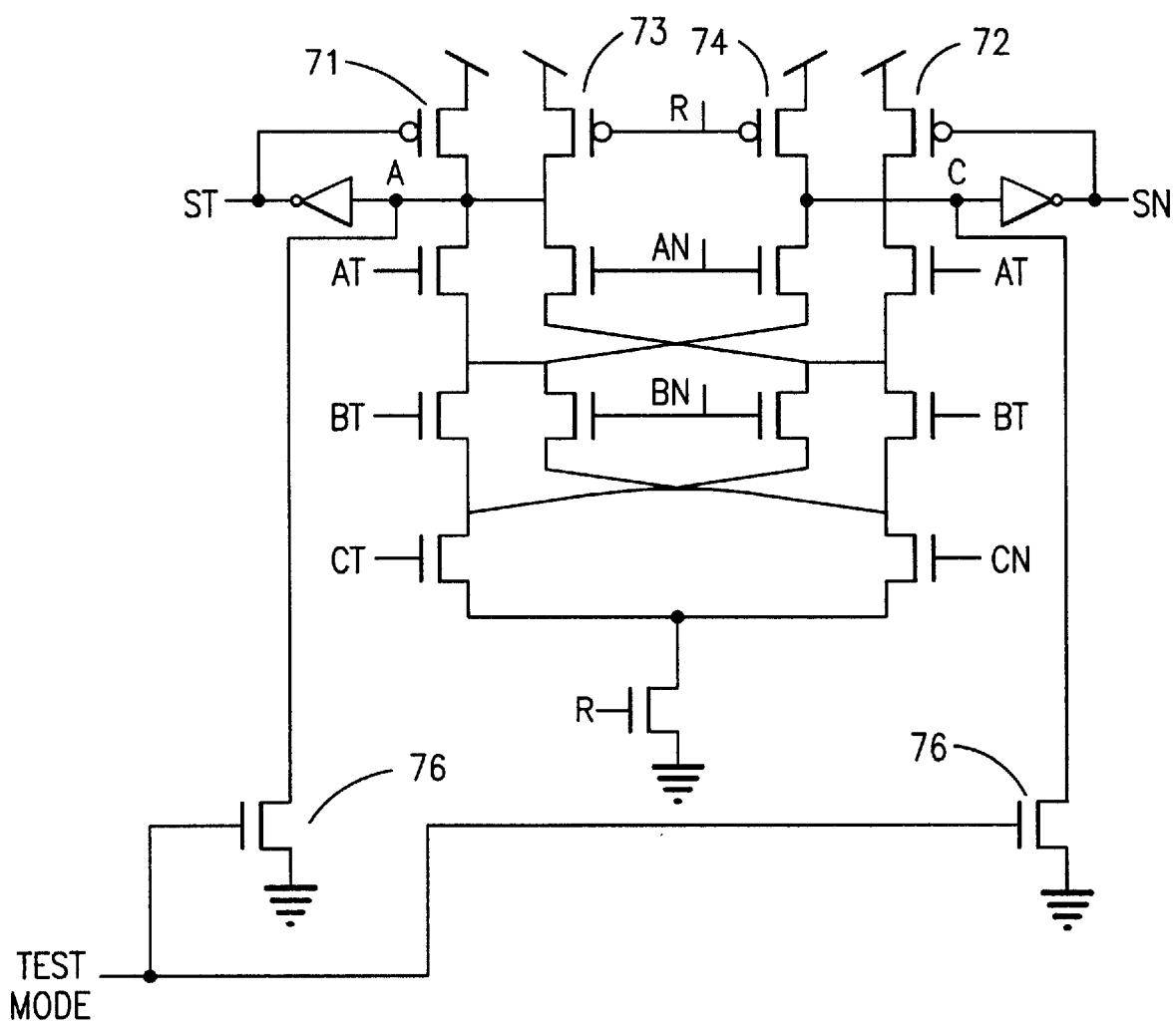
FIG. 7 illustrates a DCVS (differential cascode voltage switch) full adder sum circuit with the inventive testing device.

The present invention applies to any kind of dynamic gate. FIG. 6 illustrates an OR gate. In1 and In2 depend on (receive data from) previous stages of logic. The Test_Mode input is used as previously described for the AND gate of FIG. 5 only for testing to identify a defective keeper 60. FIG. 7 illustrates a DCVS (differential cascode voltage switch) whose operation is not critical to the present invention, but exemplifies a more complicated dynamic logic circuit implementing the present invention keeper devices 76. AT, BT, and CT indicate A-true, B-true, and C-true inputs, while AN, BN, CN indicate their complements. R indicates inputs for a common reset signal. ST and SN indicate true and complementary output signals, respectively. The invention bleeder device is shown attached to the true and complement primary nodes A and C, and to ground. These primary nodes are precharged through devices 73 and 74, respectively. The keeper devices are controlled by a common Test_Mode signal for testing the half-latches 71 and 72, which testing method also follows the sequence as described for the AND gate of FIG. 5.

The present invention could be used for any kind of dynamic logic, processor chips, high speed logic, ASICs, or high-speed memory chips (which use dynamic logic).

ALTERNATIVE EMBODIMENTS

The charge state of the dynamic gate, whether positive or negative, is effected in response to a negative or positive going pulse provided by a RESET device, which can be either a pull-up or pull-down device, coupled to the primary node, thereby selectively precharging the primary node low or high. For a gate having an N dominant logic tree, RESET is pulsed low. "Precharging" applies to low or high precharging. In a "precharge low" scenario, a primary node would be coupled (i.e. pulsed) to ground and the invention device would be implemented as a PFET coupled to a high voltage for bleeding negative charge from the primary node instead of through an NFET coupled to ground. Hence, the device for bleeding charge away from the primary node is capable of draining away either positive or negative charge. The logic tree likewise evaluates by changing the precharge state of the primary node by coupling to a high or low voltage source or leaving it in the precharge state. The illustration shown in the Figures and discussed herein show only "pulse low" and "precharge high" examples. Anyone skilled in the art can readily modify these example designs to implement the alternative embodiments just described.

The matter contained in the above description or shown in the accompanying drawings have been described for purposes of illustration and shall not be interpreted in a limiting sense. It will be appreciated that various modifications may be made in the above structure and method without departing from the scope of the invention described herein. Thus, changes and alternatives will now become apparent to those skilled in the art without departing from the spirit and scope of the invention as set forth in the following claims. Accordingly, the scope of protection of this invention is limited only by the following claims and their equivalents.

What is claimed is:

1. Method of testing a logic gate, comprising:

selectively activating a first device for pre-charging a primary node of the logic gate to a logical high voltage level;

activating a second device for maintaining the primary node at the logical high voltage level;

selectively activating a third device for bleeding the primary node of the logic gate toward a logical low voltage level at a rate less than a rate at which the second device maintains the logical high voltage level; and monitoring a logical output of the logic gate to detect whether the bleeding step has altered the logical voltage level of the primary node.

2. Apparatus comprising:

a primary node;

a circuit having an input for receiving a precharge signal and for pre-charging the primary node to a charge state defined by the pre-charge signal;

a keeper device coupled to the primary node for maintaining the primary node in the charge state defined by the precharge signal;

an output node for outputting an output signal based on the charge state of the primary node; and a testing device coupled to the primary node for discharging the charge state of the primary node at a rate less than the rate at which the keeper device maintains the primary node.

3. Apparatus of claim 2 further comprising:

a monitor coupled to the output node and monitoring the output signal for detecting a change in the output signal caused by the testing device.

4. Method of testing a logic gate having an output, a primary node, and a device for providing charge at a predesigned rate for substantially maintaining a preselected charge level of the primary node, the method comprising:

a) precharging the primary node of the gate to the preselected charge level;

b) discharging the primary node at a rate lesser in absolute magnitude than the predesigned rate; and c) monitoring an output of the gate after a beginning of the step b) for detecting an output transition caused by the step b).

5. Method of testing a logic gate, comprising:

selectively activating a first device for precharging a primary node of the logic gate to a logical low voltage level;

activating a second device for maintaining the primary node at the logical low voltage level;

selectively activating a third device for bleeding the primary node of the logic gate toward a logical high voltage level at a rate less than a rate at which the second device maintains the logical low voltage level; and monitoring a logical output of the logic gate for detecting a change in a logical voltage level of a gate output signal caused by the bleeding step after a beginning of the bleeding step.

6. Method of testing a logic gate having a primary node, an output responsive to a voltage level of the primary node, an intermediate node, and a primary node half-latch for maintaining the voltage level of the primary node, the method comprising the steps of:

a) charging the primary node to a first logical voltage level;

b) decoupling the intermediate node from the primary node including charging the intermediate node to a second logical voltage level;

c) coupling the intermediate node to the primary node; and d) monitoring the output to detect a logical voltage level shift in the primary node caused by the step c).

* * * * *